United States Patent
Wong

Patent Number: 5,396,125
Date of Patent: Mar. 7, 1995

[54] CURRENT INJECTION LOGIC

[75] Inventor: Thomas Y. Wong, Nepean, Canada

[73] Assignee: Northern Telecom Limited, Montreal, Canada

[21] Appl. No.: 118,347

[22] Filed: Sep. 9, 1993

[51] Int. Cl.⁶ .......................................... H03K 19/086
[52] U.S. Cl. ..................................... 326/126; 327/202
[58] Field of Search .......................................... 307/455

[56] References Cited

U.S. PATENT DOCUMENTS

| | | | |
|---|---|---|---|
| 4,605,871 | 8/1986 | Price et al. | 307/455 |
| 4,609,834 | 9/1986 | Gal | 307/455 |
| 4,617,475 | 10/1986 | Reinschmidt | 307/455 |
| 4,675,553 | 6/1987 | Price et al. | 307/455 |
| 4,680,486 | 7/1987 | Price et al. | 307/455 |
| 4,806,796 | 2/1989 | Bushey et al. | 307/455 |
| 4,967,106 | 10/1990 | Tamegaya | 307/455 |
| 5,220,212 | 6/1993 | Sinh | 307/455 |
| 5,266,846 | 11/1993 | Asazawa | 307/455 |
| 5,289,055 | 2/1994 | Razavi | 307/455 |

FOREIGN PATENT DOCUMENTS

| | | | |
|---|---|---|---|
| 0350261A3 | 4/1989 | European Pat. Off. | H03K 3/288 |
| 0050063A1 | 6/1992 | European Pat. Off. | H03K 19/003 |

OTHER PUBLICATIONS

20-Gb/s Digital SSI's Using AlGaAs/GaAs Heterojunction Bipolar Transistors for Future Optical Transmission Systems, Ichino, IEEE Journal of Solid-State Circuits, vol. 28, No. 2, Feb. 1993.

Application of Heterojunction Bipolar Transistors to High Speed, Small-Scale Digital Integrated Circuits, Asbeck et al, IEEE GaAs IC Symposium, 1984.

IBM Technical Disclosure Bulletin, "Single-Stage Emitter-Coupled Logic Gated Data Latch", vol. 29, No. 12, May 1987, New York, USA.

*Primary Examiner*—Edward P. Westin
*Assistant Examiner*—Richard Roseen
*Attorney, Agent, or Firm*—George MacGregor

[57] ABSTRACT

A 2-level logic 'current injection' circuit topology suitable for heterojunction bipolar transistor (HBT) technology. The circuit requires lower supply voltage headroom and demonstrates smaller propagation delay than conventional 2-level emitter coupled logic/current mode logic (ECL/CML). Master-slave flip-flop circuits have been fabricated in AlGaAs/GaAs, HBT. Test results indicate that the circuits are fully functional at 10 Gbit/s and an operating clock frequency as high as 20 GHz is recorded.

4 Claims, 8 Drawing Sheets

CURRENT INJECTION LOGIC

FIELD OF THE INVENTION

This invention relates to a 2-level, ECL type logic circuit and more particularly to a 2-level logic circuit employing a "current injection" switching configuration.

BACKGROUND

In conventional emitter coupled logic (ECL) circuits involving 2 or more logic levels the first level comprises a pair of differential, emitter coupled bipolar transistors having the circuit output taken as a differential voltage from the collectors which are tied to the positive supply through resistive loads. Complementary logic inputs are supplied to respective bases of the transistors. The common emitters are tied to the collector output of a similar transistor in the second level logic section. A common, substantially constant current source supplies current to the circuit. The base of the second level transistor is connected to the second level logic input. The transistors of the first level logic section may be selected or deselected by switching the second level transistor on or off by means of a high or low logic input to the second level logic input.

Transistors connected in cascade such as this require a supply voltage which is sufficiently high to accommodate the sum of the saturation voltages of the transistors in both logic levels. In devices fabricated from materials having a high saturation voltage such as AlGaAs/GaAs Heterojunction Bipolar Transistor (HBT) technology (typically 0.8 V CEsat and 1.5 V BEon) the power supply must be capable of supplying in the order of 6.5 V. This higher voltage naturally leads to potentially higher power consumption. Similarly performance of the logic functions may be adversely affected by device parameter variations such as current gain (Beta) when the transistors are connected in a cascade configuration. Additionally, the propagation delay of a cascade connected circuit is the sum of the delays through the transistors in each level due to the device transit time and parasitics.

SUMMARY OF THE INVENTION

The present invention provides a logic circuit for an ECL configuration which overcomes the aforementioned problems associated with connecting the first and second level transistors in cascade. The result is a lower supply voltage requirement and the concomitant, potential reduction in circuit power. The circuit is also less sensitive to variation in device parameters and a lower propagation delay results in improved speed performance.

Therefore, in accordance with a first aspect of the present invention, there is provided a two-level logic circuit comprising a first substantially constant current source connected between the emitters of first and second transistors and a negative supply. The collector of each transistor is connected to first and second outputs respectively, and the base of each of the first and second transistors is connected to complementary first level logic inputs. Load resistors are connected between the outputs and a positive supply. A second substantially constant current source is connected between the positive supply and the emitters of the first and second transistors and means associated with the second current source are provided for switching between a first condition wherein the second current source is switched off from the first current source and a second condition wherein the second current source is switched into the first current source. Preferably the first and second current sources have substantially the same magnitude.

In accordance with a second aspect of the present invention there is provided a 2-level, emitter coupled logic circuit comprising; a substantially constant current source connected between the emitters of first and second transistors and a negative supply. The collector of each transistor is coupled to first and second outputs respectively, the base of the first transistor is connected to a first logic input and the base of the second transistor is connected to a second logic input. Load resistors are connected between the outputs and a positive supply. A third transistor has its emitter connected to the current source, its collector connected to the positive supply and its base connected to a third logic input, the level of the third logic input being higher than the level of the first and second logic inputs respectively.

In accordance with a further aspect of the invention there is provided a 2-level, master-slave flip-flop utilizing the logic circuit described above.

There is also provided a circuit configuration which includes resistive means to generate the voltage differential between the first and second logic level inputs which according to a preferred embodiment is greater than the thermal voltage of the transistors.

Also, in accordance with a further aspect of the invention, there is provided a method of switching a 2-level logic circuit, the first level logic comprising first and second transistors having respective emitters connected to a first substantially constant current source which in turn is connected to a negative supply, collectors connected to first and second outputs respectively, and their bases connected to first and second complementary logic inputs. Load resistors are connected between the outputs and a positive supply. The second logic level comprises a second substantially constant current source having associated switching means connected between the emitters of the first and second transistors and the positive supply. The method according to the invention comprises activating the switching means to switch the second constant current off from the first constant current source so as to operate the logic circuit as a first logic level, and sequentially activating the switch means to switch the second current source into the first current source so as to operate the logic circuit at a second logic level. Preferably the first and second current sources have substantially the same magnitude.

BRIEF DESCRIPTION OF THE DRAWINGS

The invention will now be described in greater detail with reference to the appended drawings wherein.

DETAILED DESCRIPTION OF THE INVENTION

Figure 1:
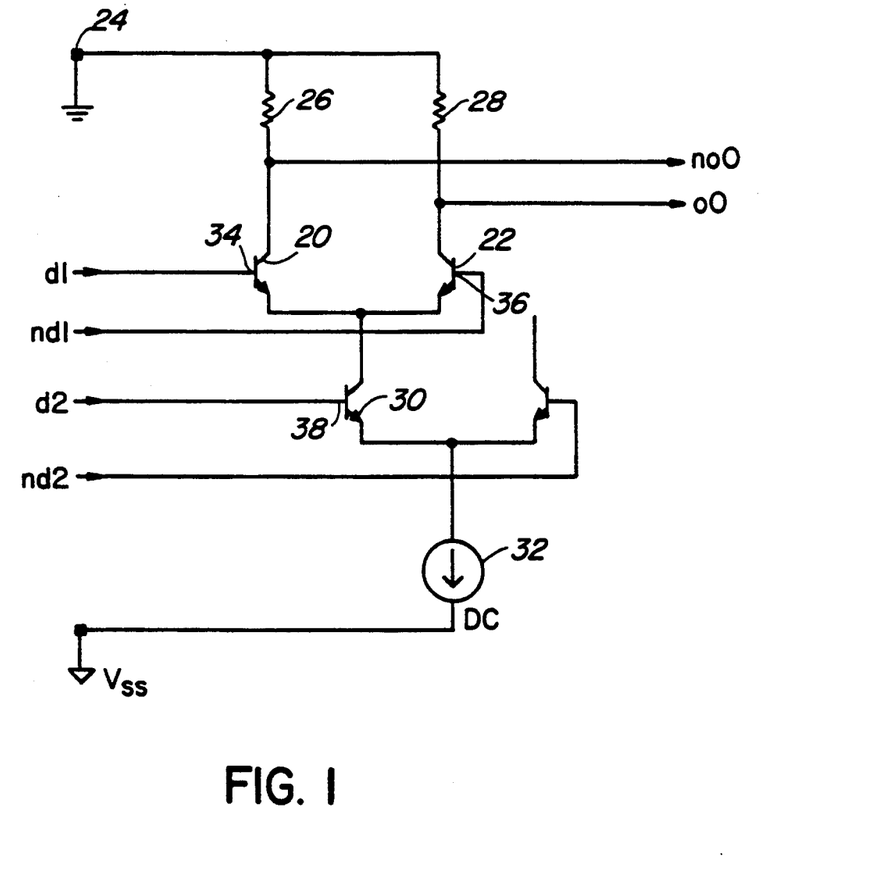
FIG. 1 is a schematic diagram of a ECL circuit of the prior art.

FIG. 1 is a diagram of a conventional 2-level ECL circuit. The first level logic section comprises emitter coupled transistors 20 and 22 having an output which is the differential voltage at respective collectors which are tied to the positive supply 24 through load resistors 26 and 28. The second level logic is controlled by transistor 30. A substantially constant current source 32 provides current to the circuit.

First level logic input is supplied to the first level transistors via logic input $d_1$ to the base 34 of transistor 20 and logic input $nd_1$ to the base 36 of transistor 22. The second level input is supplied to the base 38 of transistor 30 via logic input $d_2$. Thus, with a logic 1 at $d_2$ transistor 30 is enabled and transistors 20 and/or 22 can be turned on by a logic 1 at inputs $d_1$ and/or $nd_1$. Transistors 20 and 22, however can not be turned on if a logic 0 is supplied to transistor 30 via input $d_2$.

As discussed herein before the fact that the first and second level transistors connected in cascade results in a higher voltage requirement particularly when a material having a high saturation voltage such as AlGaAs/GaAs is used. This voltage can be typically 6.5 V for AlGaAs/GaAs HBT having a saturation voltage of 0.8 V CEsat and 1.5 V BEon. This higher voltage can potentially lead to higher power requirements for the logic circuit. Additionally, the cascade configuration results in increased sensitivity of the logic circuit to device parameter variations such as current gain (Beta) in the case of bipolar devices. Further, the propagation delay inherent in this configuration adversely affects operating speed.

Figure 2:
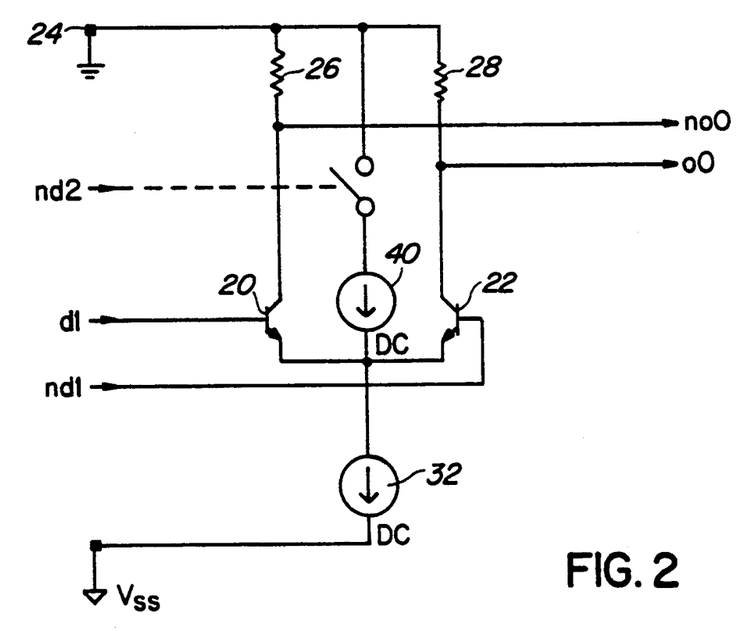
FIG. 2 is a representation of the circuit of the present invention.

Although specific reference is made to AlGaAs/GaAs HBT technology, it is to be understood that the fundamental principle of the invention applies to devices fabricated from other materials such as silicon and indeed any material from which bipolar devices may be prepared, The circuit of FIG. 2 represents in a general format the injection current switching mode according to the present invention. In this configuration, rather than switching the tail current (32) of the first level logic on and off, the tail current is maintained constant and a current 40 of equal magnitude is switched off from/into 32. Hence, the technique of switching an injected current is termed "current injection".

Figure 3:
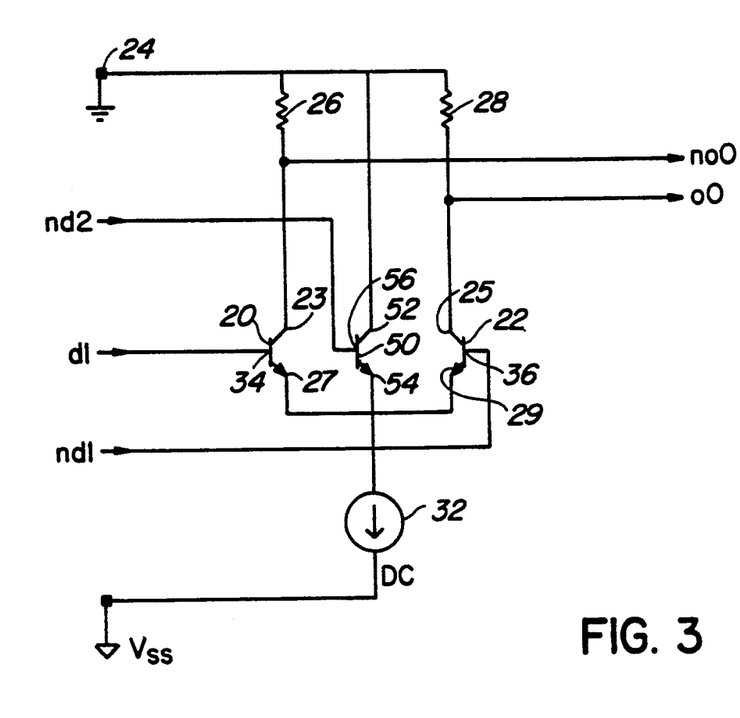
FIG. 3 is a schematic diagram of the basic circuit of the present invention.

The manner in which the representation shown in FIG. 2 is implemented in a 2-level logic circuit is illustrated schematically in FIG. 3. As shown, the input stage of the 2-level logic circuit utilizes only NPN transistors and resistors. As in the previously discussed conventional ECL technology transistors 20 and 22 are a differential pair of the first logic level. The output is the differential voltage at the collectors 23, 25 of transistors 20, 22 which are tied to the positive supply 24 of the circuit through load resistors 26 and 28. The emitters 27, 29 of transistors 20 and 22 are commonly connected to the constant current source 32. First level logic inputs $d_1$ and $nd_1$ are connected to the bases 34, 36 of transistors 20 and 22 respectively. The second level logic transistor 50 has its collector 52 tied directly to the positive supply 24 and its emitter 54 connected to the constant current source 32. The base 56 of transistor 50 is connected to the second level logic input $nd_2$. Thus, if a logic low appears on $nd_2$, transistor 50 is turned off and the output of the first level logic is determined by the logic input on $d_1$ and/or $nd_1$. The second level logic is activated by an input voltage supplied to $nd_2$ which is sufficient to turn on transistor 50 and turn off transistors 20 and 22. This requires that the voltage at the second level logic be higher than the voltage applied to the first level logic. In practice, this difference should be a few times the thermal voltage $V_t$ and it is recommended that for reliable operation the voltage on $nd_2$ be greater than the complementary voltage level on $d_1$ and $nd_1$ by 10 times $V_t$. This differential in input voltage levels is adequate to overcome noise factors in the circuit.

Because the transistors of the first and second logic levels are not connected in cascade, the supply voltage can be lower and in the case of a device fabricated from AlGaAs/GaAs HBT a voltage of 5 V is sufficient. This topology therefore represents a reduction in voltage headroom of 1.5 V. The lower voltage also leads to a potential reduction in power consumption of the logic circuit. A further advantage of the topology of the present invention is that the output swing is less sensitive to current gain (beta) variations if the logic is implemented in bipolar technology. As will be discussed herein below, this topology results in improved operating speed.

Figure 4:
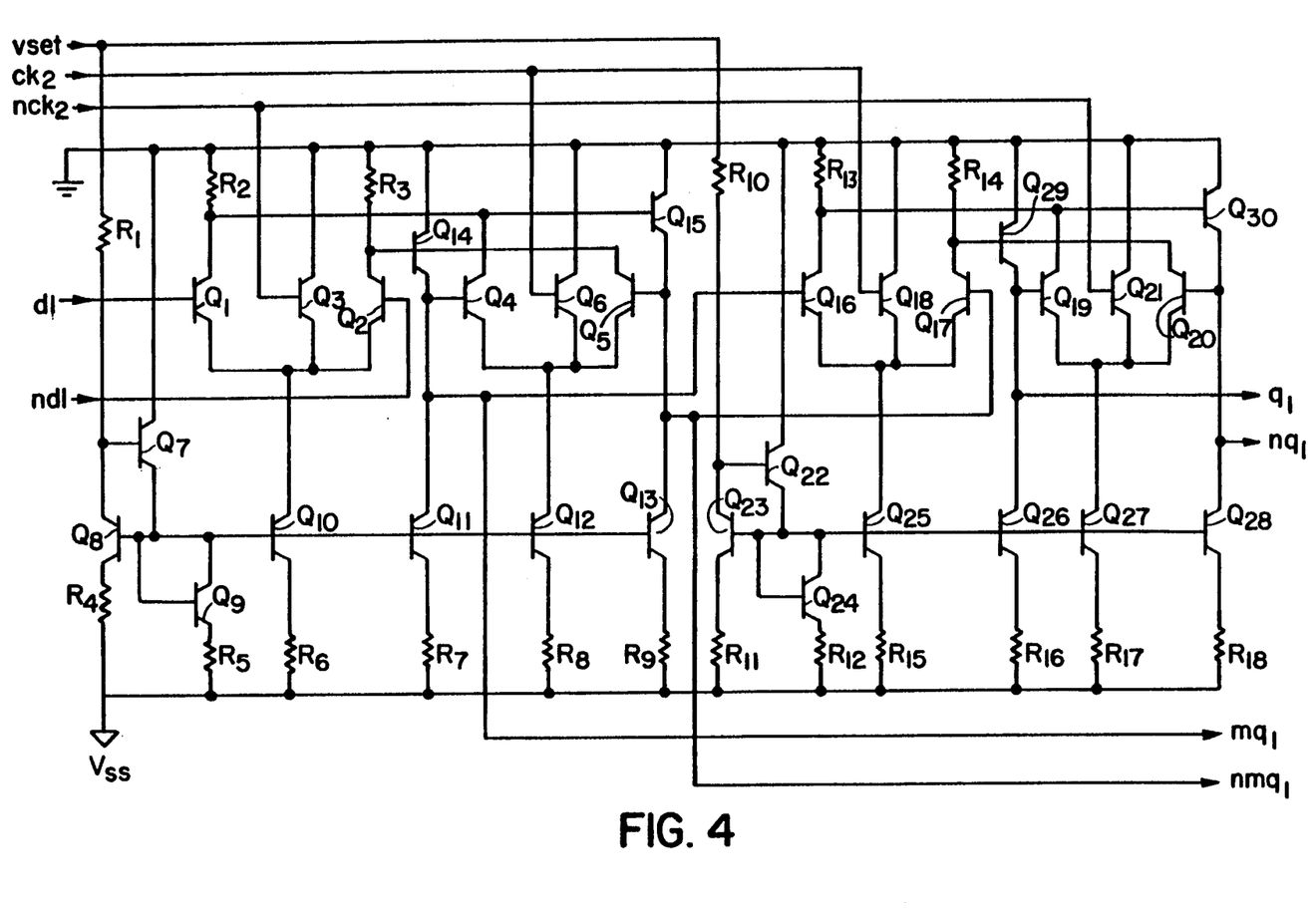
FIG. 4 is a circuit diagram of a master-slave, flip-flop utilizing the current injection configuration of the invention.

FIG. 4 is a circuit diagram of a master-slave, flip-flop utilizing the 2-level logic structure of FIG. 3.

Table 1 sets out performance characteristics of a conventional ECL flip-flop and a flip-flop fabricated in compliance with the present invention. These numbers are from post-layout simulation based on SPICE HBT computer model developed at Northern Telecom/Bell Northern Research Ltd.

TABLE 1

| | tpd (ps) | ts (ps) | th (ps) | tl (ps/100 ff) | Cin (ff) | | fan-out |
|---|---|---|---|---|---|---|---|
| | | | | | LV1 | LV2 | |
| Conventional ECL | 41 | 17 | 10 | 10 | 56 | 98 | 3 |
| 'Current injection' ECL | 30 | 27 | 0 | 10 | 44 | 96 | 3 | where:
tpd = propagation delay
ts = setup time
th = hold time
tl = loaded delay
Cin = input capacitance From these results it is apparent that a significant reduction in propagation delay has been achieved. This, of course, translates into improved speed of the logic circuit. The power dissipation of the conventional ECL master-slave, flip-flop and the "current injection" flip-flop are 100 mW and 98 mW respectively.

Figure 5:
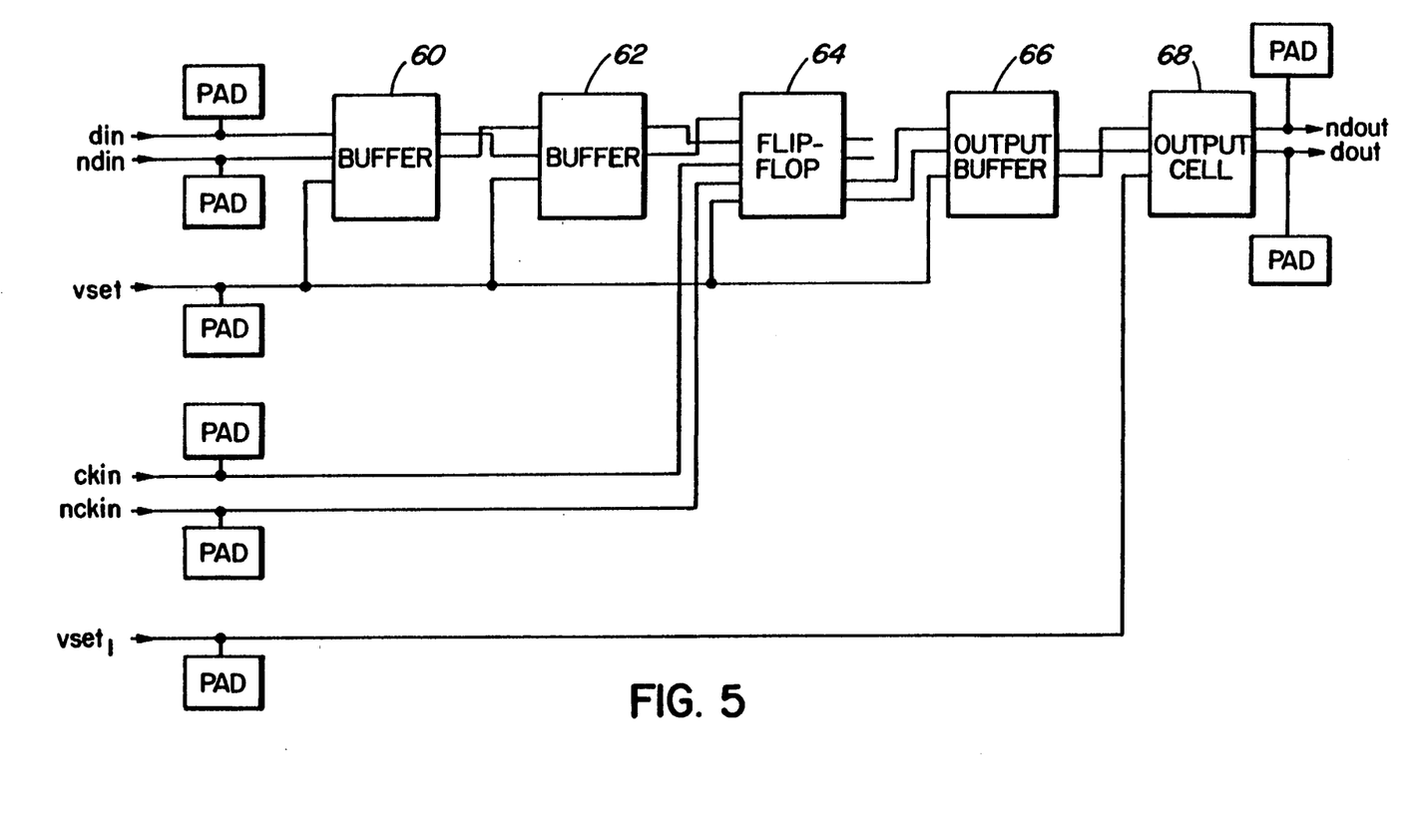
FIG. 5 is a block diagram of a decision test circuit.

FIG. 5 is a block diagram of an actual circuit fabricated to test the functionality of current injection topology. The test circuit comprises two buffers 60, 62, one master-slave flip-flop 64 with current injection, one output buffer 66, and an output cell 68 in cascade. The external clock is unbuffered allowing clock amplitude and offset to be adjusted externally. High speed signals are 50 ohm terminated and have a ground pad on each side allowing 10 Gbit/s wafer probing.

Figure 6:
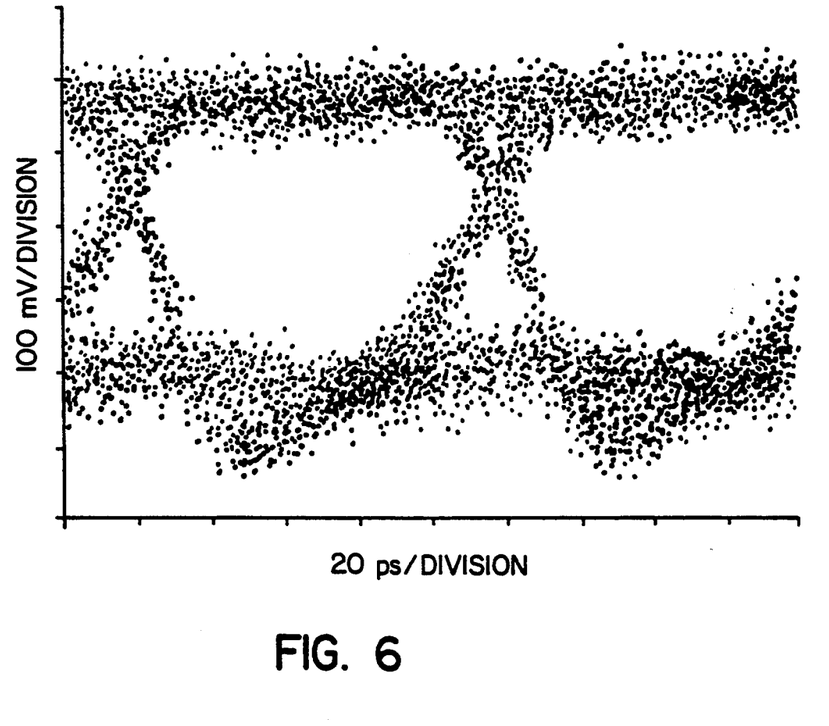
FIG. 6 is an eye diagram of the circuit of FIG. 5.

FIG. 6 is the output eye diagram of the circuit of FIG. 5 under wafer probe at 2E20-1 PRBS and 1E-9 BER. The phase margin was measured to be 71 at 2E 20-1 PRBS, 75 at 2E15-1 PRBS and improved to 81 at 2E7-1 PRBS.

Figure 7:
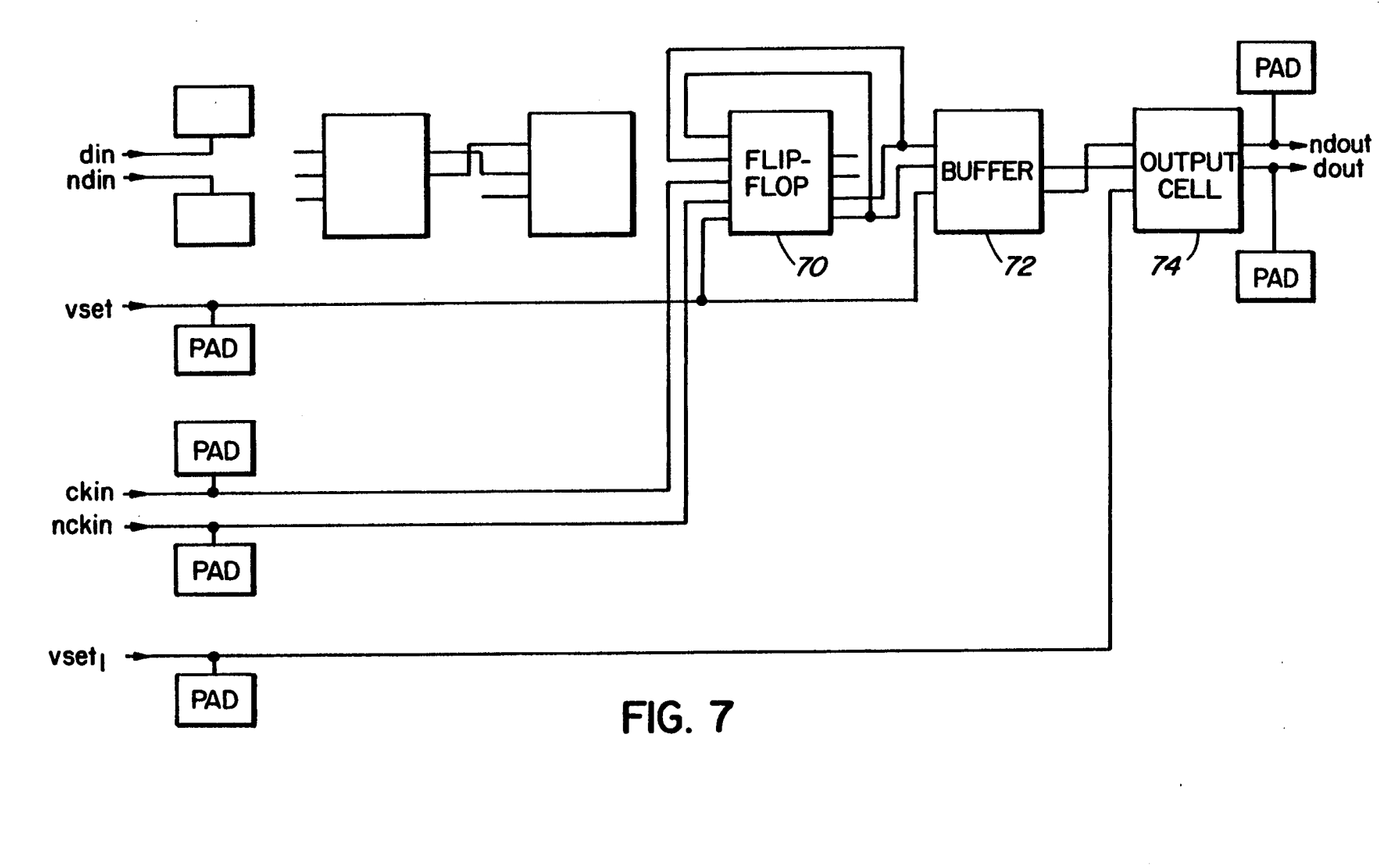
FIG. 7 is a block diagram of a divide by two test circuit.

FIG. 7 is a block diagram of an f/2 frequency divider comprising one flip-flop 70 with current injection, one buffer 72 and one output cell 74. As in FIG. 5, the external clock is unbuffered allowing clock amplitude and offset to be adjusted externally.

Figure 8:
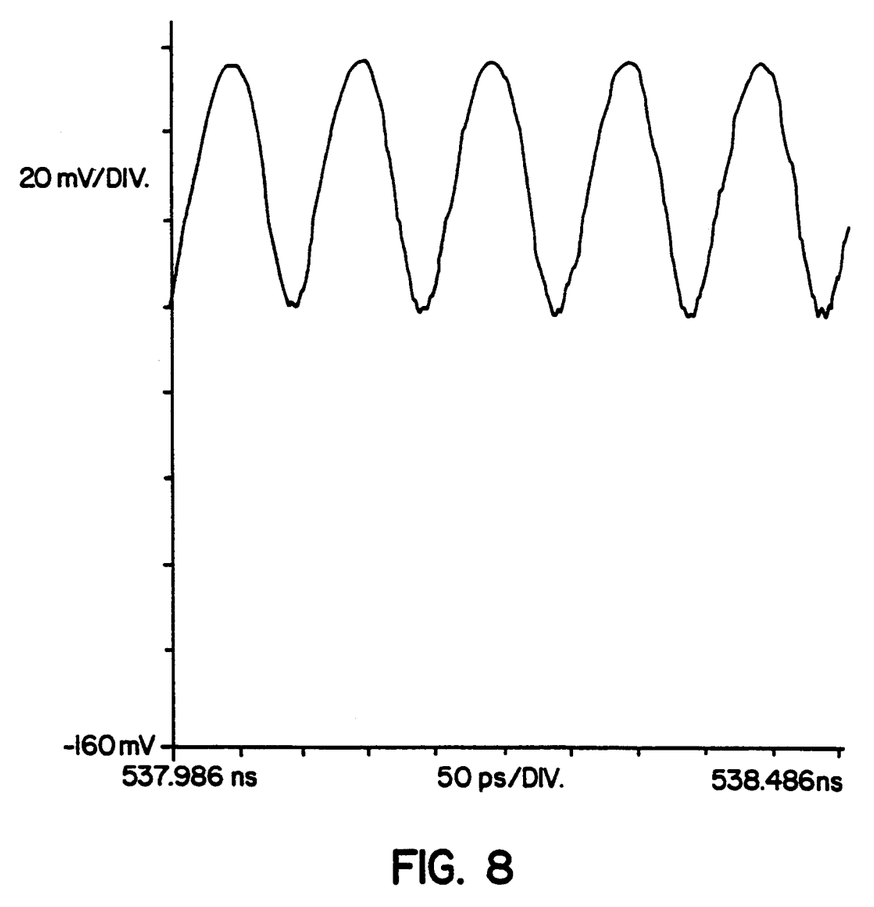
FIG. 8 is the output waveform of the circuit of FIG. 7 at 20 Ghz.

FIG. 8 shows the output waveform of the circuit of FIG. 7 under wafer probe at 20 GHz clock frequency, the maximum frequency generated by the test setup. Although designed for 10 GHz operation, the wafer probe yield at 15 GHz was 35%.

Figure 9:
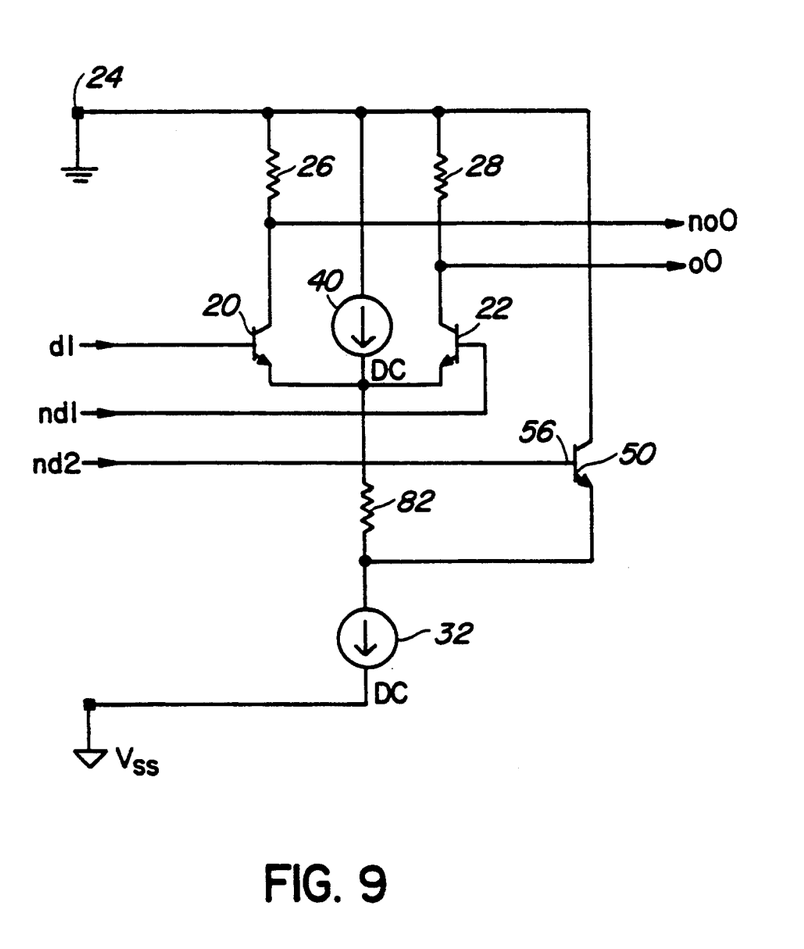
FIG. 9 is an embodiment of the invention which provides dual level input.

The topology of the present invention and more particularly as illustrated in FIG. 3 has other application when interfaced to logic of the same type. As discussed in relation to FIG. 3 there must be a voltage difference between the logic input to the first level and the logic input to the second level. For practical purposes this may be defined as 10 $V_t$. By way of example Vt may be assumed to be 25 mV at 25° C. and therefore 10 Vt=0.25 V. Thus, if the logic swing of the first level logic is −1.5 V to −2.0 V, the logic swing of the second level logic needs to be −1.25 V to −1.75 V. The circuit of FIG. 9 is an embodiment of the invention incorporating means to generate the voltage differential. More specifically a current of 2.5 mA from the current source 40 across resistor 82 (100 ohms) results in a voltage differential of 0.25 V.

A current injection topography has been described and practical embodiments thereof illustrated. Flip-flop circuits utilizing current injection have demonstrated improved speed performance when compared with conventional ECL/CML circuits. Sharing the same power bus between 1-and 2-level logic cells can be realized in as much as they have the same power supply headroom. This simplifies power bus routing. Wafer probe yield indicates that the circuit is reproducible and test results comparable.

While specific embodiments of the invention have been described and illustrate, it will be apparent to one skilled in the art that circuit variations and other modifications can be implemented without departing from the spirit and scope of the invention as defined in the following claims.

I claim:

1. A 2-level, emitter coupled logic circuit comprising:
   a substantially constant current source;
   first and second transistors having respective emitters coupled to said current source, collectors connected to first and second outputs respectively, the base of each of said first and second transistors connected to a differential, first level logic input;
   load resistors connected between said outputs and a positive supply; and
   a third transistor having its emitter connected to said current source, its collector connected to said positive supply, and its base connected to a second level logic input wherein the voltage level of said second level logic input is greater than the voltage level of said differential first level logic input by an amount greater than the thermal voltage of said third transistor and less than ten times the thermal voltage of said third transistor.

2. A master-slave flip-flop having a master section and a slave section each having a pair of 2-level emitter coupled logic circuits as defined in claim 1 with the base of each of said first and second transistors receiving a differential first level logic input and the base of each of said third transistors receiving a clock input.

3. A 2-level logic circuit as defined in claim 1 having a resistor between said current source and the common emitter connection of said first and second transistors to generate the difference in voltage between said first and second level logic inputs.

4. A 2-level logic circuit as defined in claim 1, said first, second and third transistors being AlGaAs/GaAs heterojunction bipolar transistors.

* * * * *